United States Patent [19]

Takahashi

[11] Patent Number: 5,096,425
[45] Date of Patent: Mar. 17, 1992

[54] PIN-SHAPED OR FLAT-PLATE-SHAPED PARALLEL TERMINALS OF AN ELECTRONIC OR PIEZOELECTRIC COMPONENT FOR BEING INSERTED IN A PRINTED CIRCUIT BOARD

[75] Inventor: Hiroyuki Takahashi, Kyoto, Japan

[73] Assignee: Murata Manufacturing Co., Ltd., Japan

[21] Appl. No.: 593,905

[22] Filed: Oct. 5, 1990

[30] Foreign Application Priority Data

Oct. 8, 1990 [JP] Japan .................................. 1-262673

[51] Int. Cl.⁵ .............................................. H01R 9/09
[52] U.S. Cl. ................................... 439/55; 361/405
[58] Field of Search .................. 439/885, 55, 78, 58, 439/83; 357/74, 75; 361/400, 403, 404, 405; 338/312, 322, 323, 324, 325, 329

[56] References Cited

U.S. PATENT DOCUMENTS

| | | | |
|---|---|---|---|
| 3,223,900 | 12/1965 | Wittner | 357/75 X |
| 4,652,975 | 3/1987 | Scott | 361/404 |
| 4,728,751 | 3/1988 | Canestaro et al. | 174/68.5 |
| 4,739,125 | 4/1988 | Watanabe et al. | 361/405 X |
| 4,797,647 | 1/1989 | Okubo et al. | 361/405 X |
| 4,827,611 | 5/1989 | Pai et al. | 29/843 |

FOREIGN PATENT DOCUMENTS

| | | |
|---|---|---|
| 0088435 | 9/1983 | European Pat. Off. . |
| 0268953 | 6/1988 | European Pat. Off. . |
| 0044091 | 2/1989 | Japan .................. 439/83 |
| 1151050 | 5/1969 | United Kingdom . |
| 2198291 | 6/1988 | United Kingdom . |

OTHER PUBLICATIONS

Sprague Engineering Bulletin, 3545A, Dipped Solid--Electrolyte Tantalex Capacitors.

Primary Examiner—Neil Abrams
Assistant Examiner—Khiem Nguyen
Attorney, Agent, or Firm—Ostrolenk, Faber, Gerb & Soffen

[57] ABSTRACT

Pin-shaped or flat-plate-shaped parallel terminals of an electronic or piezoelectric component for being inserted in through holes formed in a printed circuit board. The terminals are electrically connected to electrodes of the electronic component and arranged substantially parallel to each other. Each of the terminals includes a bent portion formed at a location along an axis of each terminal so as to project at least partially in a direction perpendicular to that, and the bent portions are generally at an imaginary surface defined by the terminals.

26 Claims, 4 Drawing Sheets

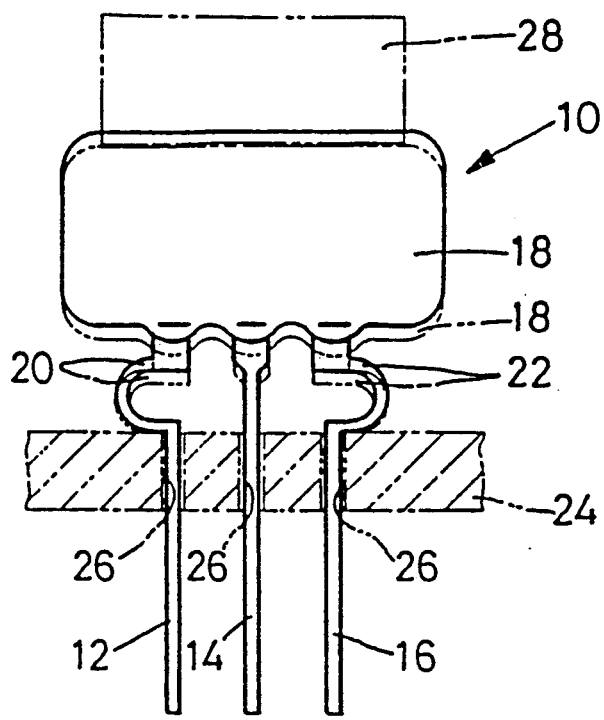
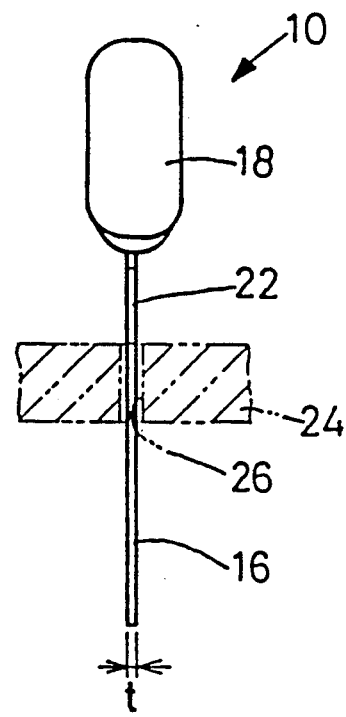
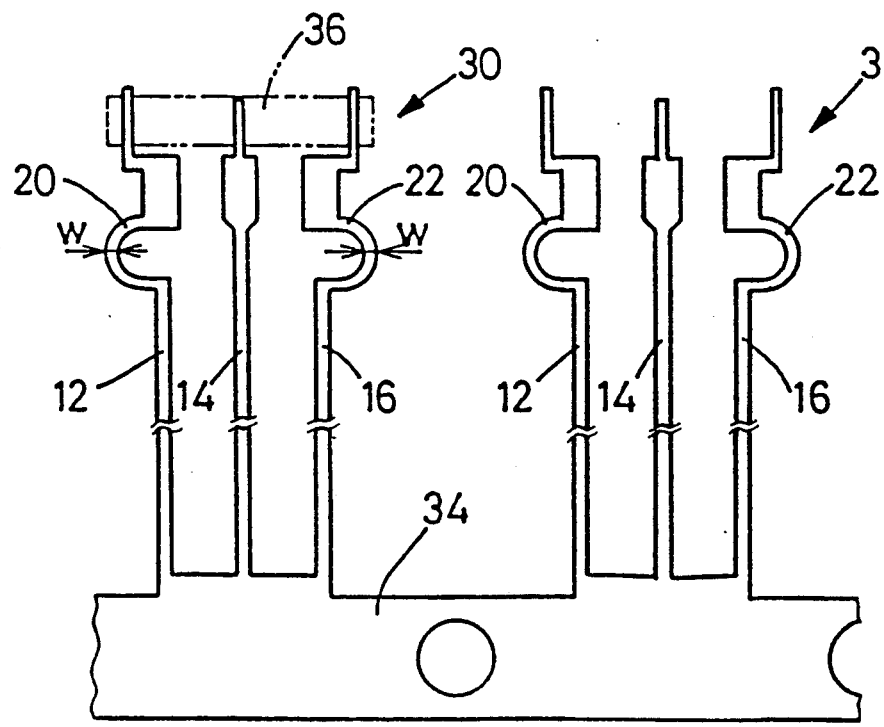

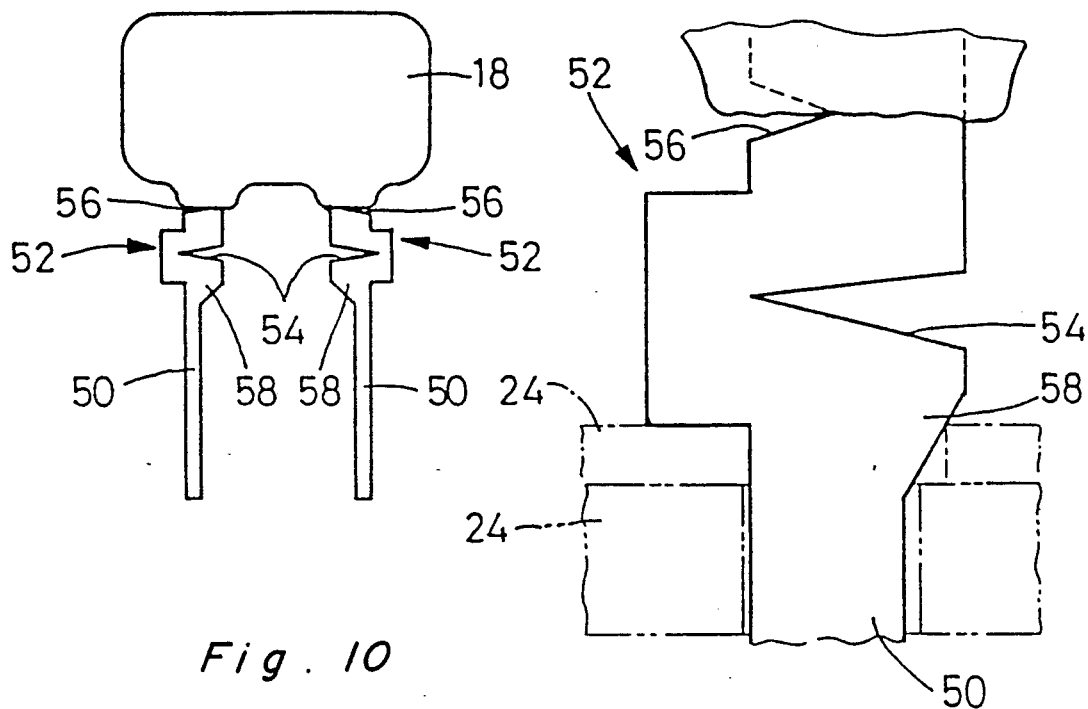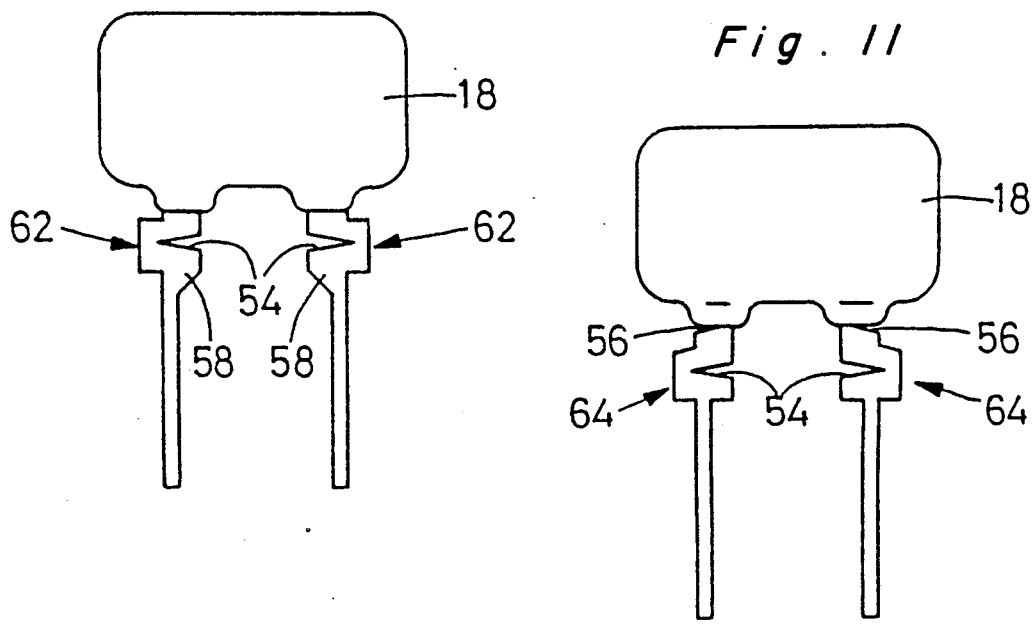

PIN-SHAPED OR FLAT-PLATE-SHAPED PARALLEL TERMINALS OF AN ELECTRONIC OR PIEZOELECTRIC COMPONENT FOR BEING INSERTED IN A PRINTED CIRCUIT BOARD

BACKGROUND OF THE INVENTION

1. Field of the Invention

The present invention relates to pin-shaped parallel terminals of an electronic component, and more particularly, to pin-shaped or flat-plate-shaped parallel terminals of an electronic or piezoelectric component for being inserted in through holes formed in a printed circuit board.

2. Description of the Related Art

Conventionally, there have been provided various kinds of electronic components such as piezoelectric ceramic filters, ceramic capacitors, resistance networks, and integrated circuits. As is apparent from the appearance of these electronic components, each of the electronic components is composed of a main body of the electronic component and terminals.

FIG. 12 shows a conventional ceramic filter 1 comprising pin-shaped parallel terminals 2.

Referring to FIG. 12, in the conventional ceramic filter 1, there are formed opposing electrodes and a common electrode on both sides of a piezoelectric ceramic substrate (not shown), respectively. Thereafter, pin-shaped terminals 2 are electrically connected to these electrodes so as to be arranged substantially in parallel to each other, and the outside of the piezoelectric ceramic substrate is covered with an outer package resin 3. Further, a stop portion 4 is formed on each of the terminals 2. When the terminals 2 are inserted into through holes 6 formed in a printed board 5 and are soldered on printed electrically conductive patterns (not shown) thereof, the outer package resin 3 formed on the terminals 2 may enter the soldering boundary between each terminal 2 and the printed conductive pattern as shown in FIG. 13, and there is a possibility of causing an imperfect connection therebetween. In order to prevent any imperfect connection, the interval between the outer package resin 3 and the printed board 5 is maintained at least at a predetermined value by the stop portions 4 of the terminals 2.

When the ceramic filter 1 having the above-mentioned structure is automatically mounted in a printed board by an automatic mounting machine, the outer package resin 3 for protecting the main body 3 of the ceramic filter 1 is held by a holding unit, and then, the terminals 2 thereof are inserted into the through holes 6 formed in the printed board 5, respectively. After the terminals 2 have been inserted into the through holes 6, respectively, the upper surface of the outer package resin 3 is struck by a pressing member 7 of the automatic mounting machine as shown in FIG. 12, in order to reliably insert the terminals 2 of the ceramic filter 1 into the printed board 5 to a predetermined depth. However, the upper surface of the outer package resin 3 is often struck relatively strongly by the pressing member 7. Therefore, the outer package resin 3 may be broken by an impulsive force of the pressing member 7, or sometimes the main body itself such as the piezoelectric ceramic substrate of the ceramic filter 1 may be broken.

In order to solve the above-mentioned problems, the material of the outer package resin 3 of each of the parts, held in a tape, to be mounted by the automatic mounting machine, is replaced with another material stronger than a predetermined standard material, or as shown in FIG. 14, an outer package resin 8 made of relatively stronger resin forms a further cover on the conventional outer package resin 3. However, when a relatively strong resin is used as the additional outer package resin 8, a large stress can be caused by the hardening and constriction thereof and can act on the piezoelectric ceramic substrate. Therefore, the piezoelectric vibration is seriously influenced in such a piezoelectric device, which is very sensitive to the outside stress. In this case, deterioration of the electric characteristics thereof cannot be prevented, and also, an increase in the rate of change of the weatherproofing properties of the part can not be prevented. Furthermore, accompanying an increase in the cost of the materials and an increase in the number of manufacturing steps, the cost of the ceramic filter 1 further increases.

It is to be noted that, in FIG. 14, 70 denotes the piezoelectric ceramic substrate, 71 denotes the opposing electrode, and 72 denotes the common electrode.

In order to solve the above-mentioned problems, the present applicant proposed in Japanese utility model application No. 1-71100/1989 to form a bent portion 9, which is bent so as to be curved in the direction of the thickness of each terminal 2 or in a direction opposite to a flat surface formed by a train of the terminals 2, in a portion along the axis of each of the terminals 2, as shown in FIG. 15. The impulsive force applied in the axis direction of each terminal 2 is absorbed by a spring force of the bent portion 9 by this technique, and the main body of the electronic component can be effectively protected from the impulsive force which is applied during automatic mounting. However, in the case that the end of the bent portion 9 extends beyond the side surface of the outer package resin 3 because of a manufacturing variation of the dimension thereof, then when the electronic component 1 is held between holding fingers of the holding unit of the automatic mounting machine, a holding finger thereof may come into contact with the bent portion 9, resulting in a chucking error and causing another electronic component to be held by mistake by the holding unit.

Further, in the case that respective bent portions 9 are formed in respective terminals 2 of the electronic component 1 in the same bending direction thereof, then when the terminals 2 are inserted in the through holes 6 formed in the printed board 5, the electronic component 1 may be inclined to the surface of the printed board 5.

The invention disclosed in the above-mentioned Japanese Utility model application No. 1-71100/1989 can solve this problem, as follows. As shown in FIG. 15, the bending portions 9 are formed with alternating bending directions, such that the bending directions of each pair of adjacent bending portions 9 are opposite to each other, alternately. In this case, when the terminals 2 of the electronic component 1 are inserted in the through holes 6 formed in the printed board 5, the electronic component 1 receives a reaction spring force from both sides of a virtual surface defined by the series of the through holes 6. Accordingly, the electronic component 1 can be prevented from being inclined to the surface of the printed board 5. In case it is only desired to use two terminals of a set of three terminals 2, the center terminal 2 is cut and removed from among the three terminals 2, and then, the remaining two end terminals 2 are utilized as the terminals of the electronic component.

However, when the center terminal 2 of the electronic component 1 is cut and removed as described above, and the remaining terminals 2 are inserted in the through holes 6, the component 1 is not vertically fixed therein, since it receives a reaction spring force from one side of the above-mentioned virtual surface defined by the series of the through holes 6, since the bending directions of the respective bending portions 9 formed in both end terminals 2 are the same. This causes again the problem that the electronic component is inclined to the surface of the printed board 5 by the reaction force.

SUMMARY OF THE INVENTION

An essential object of the present invention is to provide pin-shaped parallel terminals of an electronic component capable of preventing the terminals from being inclined to a surface of a printed board when the terminals are inserted in through holes formed in the printed board, even though the electronic component comprises a pair of two terminals.

Another object of the present invention is to provide pin-shaped parallel terminals of an electronic component capable of effectively protecting the main body of the electronic component from an impulsive force which is applied during automatic mounting, and also capable of preventing the above-mentioned chucking error.

In order to accomplish the above objects, according to one aspect of the present invention, pin-shaped parallel terminals are provided in an electronic component for inserting in through holes formed in a printed board, said terminals being electrically connected to electrodes of said electronic component so as to be arranged substantially parallel to each other, each of said terminals comprising a bending portion formed in one portion of an axis of each of said terminals so as to have a portion extending in a direction perpendicular to a direction of the axis of said terminals, said bending portions being at a flat surface defined by said axes of said terminals.

According to another aspect of the present invention, pin-shaped parallel terminals are provided on an electronic component for inserting in through holes formed in a printed board, said terminals being electrically connected to electrodes of said electronic component so as to be arranged substantially parallel to each other, at least two of said terminals positioned on both ends of said component comprising a bending portion formed in one portion of an axis of each of said terminals so as to have a portion extending in a direction perpendicular to a direction of the axis of said terminals, said bending portions being at a flat surface defined by said axes of said terminals.

BRIEF DESCRIPTION OF THE DRAWINGS

These and other objects and features of the present invention will become clear from the following description of preferred embodiments thereof with reference to the accompanying drawings, in which:

FIG. 1 is a front view of an electronic component comprising pin-shaped parallel terminals according to a preferred embodiment of the present invention;

FIG. 2 is a side view of the electronic component shown in FIG. 1;

FIG. 3a is a front view showing the terminals of the electronic components connected to a hoop;

FIG. 3b is a side view showing the end portion of each terminal of the electronic component shown in FIG. 3a;

FIGS. 4 to 8 are front views showing electronic components comprising pin-shaped parallel terminals according to other preferred embodiments, besides the preferred embodiment shown in FIGS. 1 and 2;

FIG. 9 is an enlarged front view showing a bending portion of the terminal of the electronic component shown in FIG. 8;

FIGS. 10 and 11 are front views showing electronic components comprising pin-shaped parallel terminals according to further preferred embodiments;

DETAILED DESCRIPTION OF THE PREFERRED EMBODIMENTS

Figure 4:
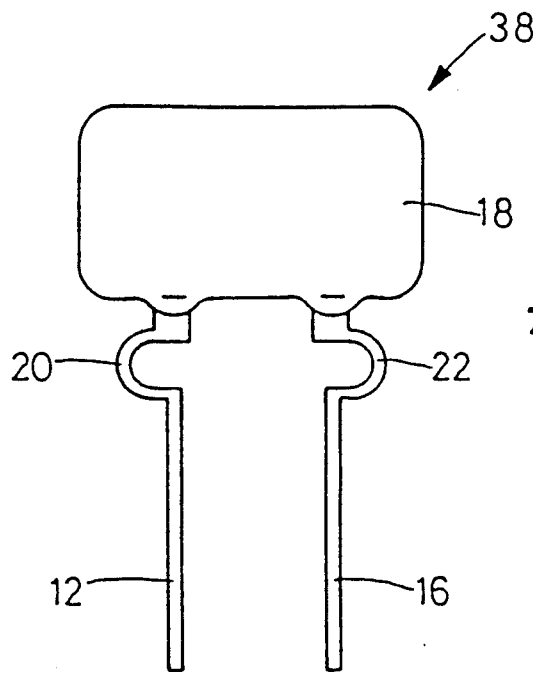

Preferred embodiments according to the present invention will be described below with reference to the attached drawings.

FIG. 1 is a front view of a ceramic filter 10 comprising pin-shaped parallel terminals 12, 14 and 16 of a preferred embodiment according to the present invention, and FIG. 2 is a side view of the ceramic filter 10 shown in FIG. 1.

A process for manufacturing the ceramic filter 10 will be described below with reference to FIGS. 1 and 2.

Referring to FIGS. 1 and 2, opposing electrodes and a common electrode are formed on both surfaces of a piezoelectric ceramic substrate (not shown), respectively, and pin-shaped terminals 12, 14 and 16 are electrically connected to respective first portions of the opposing electrodes and the common electrode, for example, by soldering, so as to be arranged substantially in parallel to each other. Thereafter, respective surfaces of the piezoelectric ceramic substrate are covered by an outer package resin 18 so as to protect the main body of the ceramic filter 10.

In first portions, close to the outer package resin 18, of the end terminals 12 and 16 which, together with the center terminals 14, form a set of three terminals 12, 14 and 16 of the ceramic filter 10, there are formed bending portions 20 and 22, respectively, as follows. Each of the bending portions 20 and 22 has a curvature having a component in a direction perpendicular to the axis of the terminals 12 and 16, and also, these bending portions 20 and 22 are formed within an imaginary flat surface defined by the series of the terminals 12, 14 and 16. Further, the bending direction of the bending portion 20 formed in the terminal 12 is opposite to that of the bending portion 22 of the terminal 16, and the adjacent terminals are not in contact with each other.

The ceramic filters 10 manufactured as described above are attached to a tape so as to make a taped series of ceramic filters for automatic mounting. Upon automatic mounting, the outer package resin 18 of the ceramic filter 10 is held between holding fingers of a holding unit of an automatic mounting machine, and the ceramic filter 10 is carried to a predetermined position located on a printed board 24 Then, the terminals 12, 14 and 16 are inserted in through holes 26 formed in the printed board 24. After the terminals 12, 14 and 16 have been inserted in the through holes 26, the upper surface of the outer package resin 18 is struck by a pressing member 28 of the automatic mounting machine, in order to securely insert these terminals 12, 14 and 16 in the through holes 26 to a predetermined depth. Namely, if the terminals 12, 14 and 16 of the ceramic filter 10 rise up from the through holes 26, the ceramic filter 10 is pressed toward the printed board 24.

When the upper surface of the outer package resin 18 of the ceramic filter 10 is struck by the pressing member 28, an impulsive force is applied onto the ceramic filter 10. This causes the terminal 14 of the ceramic filter 10 to slide in the direction of its axis, responsive to the impulsive force, so as to permit the action of the impulsive force. On the other hand, each of the bending portions 20 and 22 of the terminals 12 and 16 converts the impulsive force into a bending moment so as to receive and absorb the above impulsive force. As a result, any extremely large force is prevented from being applied onto the outer package resin 18, so the outer package resin 18 can be prevented from being broken, and also, the piezoelectric ceramics substrate itself can be prevented from being broken.

In the case of electronic components such as the ceramic filter 10, as shown in FIG. 3a, plural terminal groups 30, 32, . . . , each terminal group comprising three terminals 12, 14 and 16, are integrally formed with a hoop 34 so as to connect the terminals and hold them substantially in parallel to each other.

The terminal groups 30, 32, . . . , connected with the hoop 34 are made as follows. After a band plate having a predetermined thickness is continuously cut using a metallic mold by a presser, the end of each of the terminals 12, 14 and 16 is bent and formed as shown in FIG. 3b so as to be easily held on a piezoelectric ceramic substrate 36 and to be easily soldered on the electrodes formed on the piezoelectric ceramic substrate 36. On the other hand, the width and the shape of each of the bending portions 20 and 22 of the terminals 12 and 16 are set by the metallic mold, and also, are set so that the bending portions 20 and 22 can tolerate a previously supposed impulsive force.

In the relationship between the width W (FIG. 3a) of each of the bending portions 20 and 22 and the thickness t (FIG. 2) of the plate thereof, the width W is set preferably so as to be smaller than the thickness t. When the width W of each of the bending portions 20 and 22 is set so as to be smaller than the thickness t thereof, the flexural rigidity around the axis perpendicular to the axis in the direction of the thickness t in each of the bending portions 20 and 22, i.e., around the axis perpendicular to the surface of FIG. 1, FIG. 3a, etc., can be set so as to be smaller than that around the axis parallel to the axis in the direction of the width W thereof, i.e., around the axis parallel to the surface of the drawings. Therefore, as indicated by the long-and-short dashed lines in FIG. 1, an impulsive force applied onto the ceramic filter 10 is converted into only a force of a movement in the direction of the axis of the terminals 12, 14 and 16 so as to be absorbed. Thus, the outer package resin 18 can be prevented from being inclined in a direction out of, or perpendicular to, the surface of the drawings, or inclined to the surface of the printed board 24.

According to an experiment performed by the present inventors, in the case of a thickness t of 0.40 mm of each of the bending portions 20 and 22 and a width W of 0.35 mm, a good result was obtained in the experiment.

The preferred embodiment according to the present invention is described above. However, the present invention is not limited to this. The present invention can be applied to the following modifications.

For example, as shown in FIG. 4, a two terminal type electronic component 38 can be made using the above-mentioned terminals according to the present invention. In this case, each center terminal 14 is cut and removed from the terminal groups 30, 32, . . . , wherein each terminal group is composed of three terminals 12, 14 and 16, as shown in FIG. 3a. In this case, the electronic component 38 has a symmetrical shape. When the terminals 12 and 16 are inserted in the through holes formed in the printed board, the reaction induced from the printed board becomes symmetric. Therefore, the electronic component 38 can be prevented from being inclined to the surface of the printed board.

Figure 5:
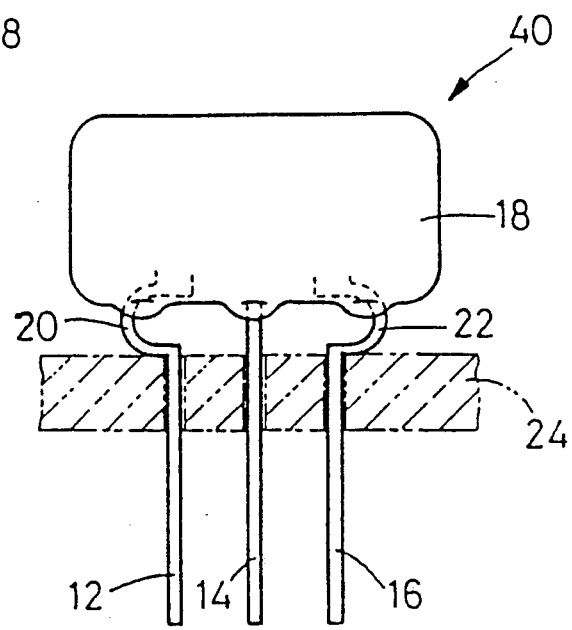

Further, as shown in FIG. 5, approximately half of each of the bending portions 20 and 22 formed in the terminals 12 and 16 may be contained within the outer package resin 18. In this case, the interval between the outer package resin 18 and the printed board 24 can be narrowed, and there can be provided a smaller electronic component 40.

Figure 6:
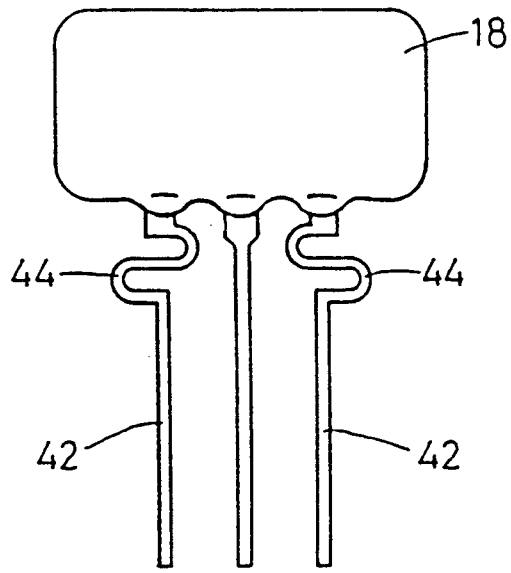
Figure 7:
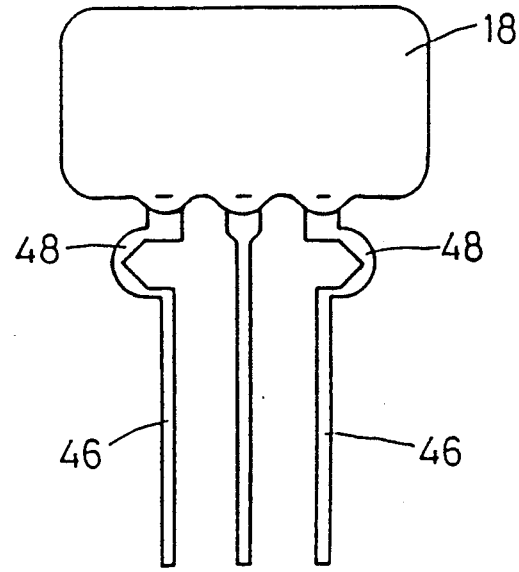
Figure 12:
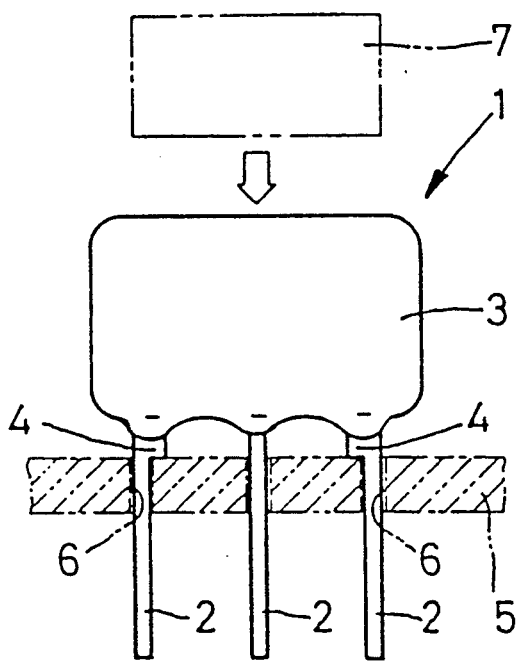
FIG. 12 is a front view showing a conventional electronic component comprising pin-shaped parallel terminals.
Figure 13:
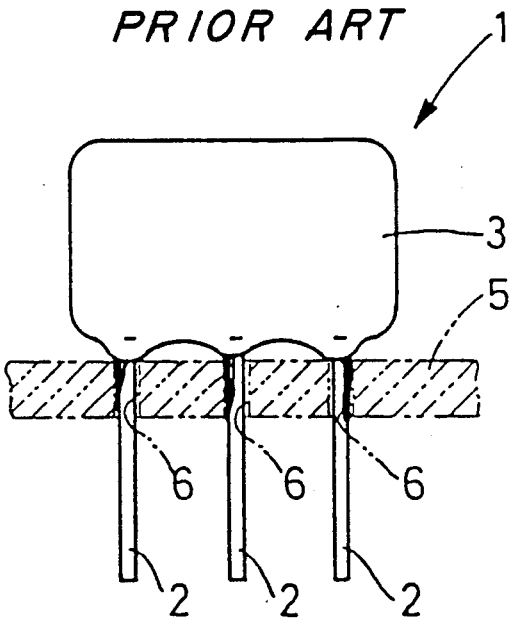
FIG. 13 is a front view showing another conventional electronic component comprising pin-shaped parallel terminals which is provided for explaining problems thereof.
Figure 14:
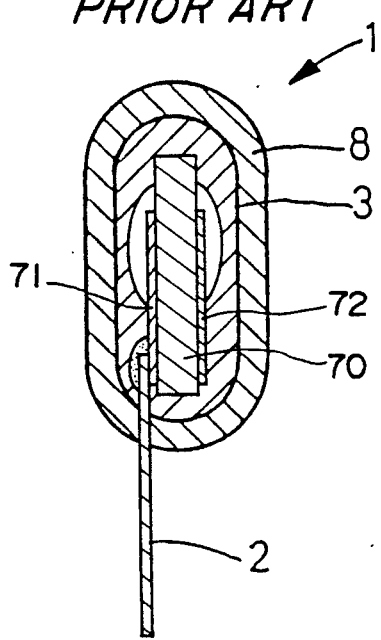
FIG. 14 is a schematic cross sectional view showing another conventional electronic component comprising pin-shaped parallel terminals.
Figure 15:
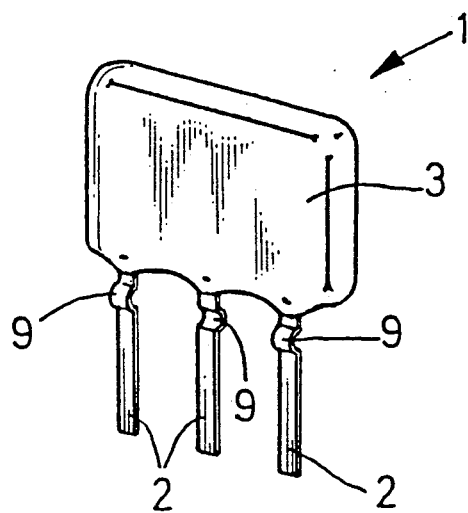
FIG. 15 is a perspective view showing a further conventional electronic component comprising pin-shaped parallel terminals

Furthermore, as shown in FIG. 6, a bending portion 44 formed in a terminal 42 may have a shape of a character S. Still further, FIG. 7 shows that a bending portion 48 formed in a terminal 46 may have a shape of a V notch. The shape of the bending portion is not limited to these examples. By utilizing the member of the bending portion as a spring, or by concentrating a stress on the S portion or the notch portion of the bending portion, a spring force of the member, in these portions on which the stress is concentrated, may be utilized.

Further, as shown in FIG. 8, triangle-shaped cut portions 54 and 56 can be formed in a bending portion 52 formed in a terminal 50.

FIG. 9 is an enlarged front view of the bending portion 52 shown in FIG. 8. As shown in FIG. 9, cut portions 54 and 56 having a triangular cut extending in a direction perpendicular to the axis direction of the terminal 50 are formed in the terminals 50, and then, the terminal 50 is constituted so that the cut gap of each of the cut portions 54 and 56 becomes small when an extremely large impulsive force is applied onto the upper surface of the outer package resin 18. In this case, a frictional resistance portion 58, for being in contact with the inner surface of the through hole 26 of the printed board 24 when the electronic component is mounted therein, is formed in a portion of each terminal 50 positioned lower than the cut portion 54. Thus, the impulsive force applied onto the electronic component 60 in the axis direction of the terminal 50 is decreased by a frictional resistance which occurs between the inner surface of the through hole 26 of the printed board 24 and the frictional resistance portion 58 of each terminal 50, whereby the extremely large impulsive force is absorbed by the cut portions 54 and 56, as described above.

As shown in FIG. 10, a cut portion 56 may not be formed in a terminal, and a bending portion 62 may be constituted by only the cut portion 54. However, in this case, since the bending portion 62 may be deformed in a rotation direction around the axis of the terminal, it is possible that a tensile stress may act on the bottom portion of the outer package resin 18.

Furthermore, as shown in FIG. 11, the frictional resistance portion 58 may not be formed in the terminal, and a bending portion 64 may be constituted by only the cut portions 54 and 56.

The preferred embodiments according to the present invention are described above. However, the present invention is not limited to a three-terminal-type filter such as a ceramic filter being the electronic component to which the present invention is applied. The present invention can be applied to various kinds of electronic components, and various kinds of electronic devices, such as a three-terminal-type discriminator, a trap, and a two-terminal type discriminator. Further, the shape of the portion to be connected to the electrodes of the main body of the electronic component which is the end of the terminal is not limited to that shown in FIG. 3b.

As described above, according to the preferred embodiments of the present invention, since the bending portion is formed in one portion of the axis of each terminal of the electronic component so as to extend partly in the direction perpendicular to the axis direction of the terminal, an impulsive force applied to the electronic component is absorbed by the spring force of the bending portion. Therefore, since no large impulsive force is applied onto the outer package resin, the outer package resin can be prevented from being broken, and also, the main body of the electronic component can be prevented from being broken. Accordingly, since it is not necessary to use a resin having a high strength as the material of the outer package resin, the invention can prevent not only the influence on the electric characteristics of the electronic component accompanying the hardening and constriction of the resin, but also the influence on the change in the weatherproofing properties thereof. Further, since it is not necessary to use an expensive resin material and also to perform a secondary process such as a folding process when forming the bending portion, an extremely inexpensive tape-mounted electronic component or electronic device can be provided.

Since the bending portion formed in each terminal of the electronic component is generally at the imaginary flat surface formed by the series of terminals, the bending portion cannot contact the holding fingers of the holding unit when the electronic component is held between the holding fingers of the holding unit of the automatic mounting machine. Even though there may be variations in the thickness of the outer package resin, the above-mentioned chucking errors can be prevented.

Furthermore, since the terminals of the preferred embodiment of the present invention are constituted by terminal groups each composed of a set of three terminals, and the bending portions are formed in the two end terminals, not all three terminals, the present invention can be applied to both a three-terminal-type electronic component, and a two-terminal-type electronic component. Such a terminal-type electronic component can be easily made by cutting and removing the center terminal of the original three terminals. Further, even after the center terminal is cut and removed, the symmetrical relationship of the electronic component can be kept. Therefore, when the terminals of the electronic component are inserted in the through holes formed in the printed board, respectively, the electronic component is fixed therein perpendicularly to the surface of the printed board.

Furthermore, by setting the width W of each bending portion so as to be smaller than the thickness t thereof, the bending direction of each bending portion can be restricted to being only the direction in which the gap of the bending portion becomes small. Therefore, each terminal can be prevented from being bent in the rotation direction around the axis parallel to the direction of the width W of the bending portion having a large flexural rigidity. Further, the electronic component can be prevented from being inclined to the surface of the printed board because of bending of the bending portion.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. Flat-plate-shaped parallel terminals of a piezoelectric printed circuit board, each said terminal being formed by cutting a flat plate having a predetermined thickness thereby producing a flat-plate-shaped terminal, said terminals being electrically connected to electrodes of said piezoelectric component and arranged substantially parallel to each other,
   a selected pair of said terminals each comprising a bent portion formed at a location along an axis of each said terminal so as to project partially in a direction perpendicular to said axis, said bent portions being formed generally at an imaginary surface defined by the axes of said selected terminals,
   wherein a width of each said bent portion along said imaginary surface is smaller than said predetermined thickness thereof.

2. The terminals as claimed in claim 1, wherein each said terminal extends substantially along said axis thereof, except at said bent portions.

3. The terminals as claimed in claim 1, wherein each said bent portion is substantially U-shaped.

4. The terminals as claimed in claim 3, wherein each said bent portion is partially contained within said component.

5. The terminals as claimed in claim 1, wherein each said bent portion is partially contained within said component.

6. The terminals as claimed in claim 1, wherein each said bent portion is substantially S-shaped.

7. The terminals as claimed in claim 1, wherein each said bent portion has a substantially V-shaped notch formed therein.

8. The terminals as claimed in claim 7, wherein each said bent portion has a portion near said V-shaped notch for engaging said printed circuit board.

9. The terminals as claimed in claim 8, wherein said engaging portion is substantially perpendicular to said terminal.

10. The terminals as claimed in claim 8, wherein said engaging portion is angled with respect to said terminal.

11. The terminals as claimed in claim 1, wherein said bent portions are formed so that the bending direction of one bent portion is opposite to that of the other bent portion.

12. The terminals as claimed in claim 1,
wherein a terminal group of said component is constituted by three or more of said terminals,
plural sets of terminal groups are integrally formed with a hoop so as to be connected therewith and substantially parallel to each other, and
the two terminals positioned at respective ends of each said terminal group comprise said bent portion.

13. The terminals as claimed in claim 12,
wherein said bent portions are formed so that the bending direction of one bent portion is opposite to that of the other bent portion in each said terminal group.

14. Flat-plate-shaped parallel terminals of a piezoelectric component for being inserted in through holes formed in a printed circuit board, each said terminal being formed by cutting a flat plate having a predetermined thickness thereby producing a flat-plate-shaped terminal, said terminals being electrically connected to electrodes of said piezoelectric component and arranged substantially parallel to each other,
two terminals positioned at respective ends of said component each comprising a bent portion formed at a location along an axis of said terminal so as to project partially in a direction perpendicular to said axis, said bent portions being formed generally at an imaginary surface defined by the axes of said terminals,
wherein a width of each said bent portion along said imaginary surface is smaller than said predetermined thickness thereof.

15. The terminals as claimed in claim 14,
wherein said bent portions are formed so that the bending direction of one bent portion is opposite to that of the other bent portion.

16. The terminals as claimed in claim 14,
wherein a terminal group of said component is constituted by three or more of said terminals,
plural sets of terminal groups are integrally formed with a hoop so as to be connected therewith and substantially parallel to each other, and
the two terminals positioned at respective ends of each said terminal group comprise said bent portion.

17. The terminals as claimed in claim 16,
wherein said bent portions are formed so that the bending direction of one bent portion is opposite to that of the other bent portion in each said terminal group.

18. The terminals as claimed in claim 14, wherein each said terminal extends substantially along said axis thereof, except at said bent portions.

19. The terminals as claimed in claim 14, wherein each said bent portion is substantially U-shaped.

20. The terminals as claimed in claim 19, wherein each said bent portion is partially contained within said component.

21. The terminals as claimed in claim 14, wherein each said bent portion is partially contained within said component.

22. The terminals as claimed in claim 14, wherein each said bent portion is substantially S-shaped.

23. The terminals as claimed in claim 14, wherein each said bent portion has a substantially V-shaped notch formed therein.

24. The terminals as claimed in claim 23, wherein each said bent portion has a portion near said V-shaped notch for engaging said printed circuit board.

25. The terminals as claimed in claim 24, wherein said engaging portion is substantially perpendicular to said terminal.

26. The terminals as claimed in claim 24, wherein said engaging portion is angled with respect to said terminal.

* * * * *

UNITED STATES PATENT AND TRADEMARK OFFICE
CERTIFICATE OF CORRECTION

PATENT NO. : 5,096,425
DATED : March 17, 1992
INVENTOR(S) : Hiroyuki Takahashi

It is certified that error appears in the above-indentified patent and that said Letters Patent is hereby corrected as shown below:

On the Title page, item [30], Foreign Application Priority Data, insert
Oct. 8, 1989 [JP] Japan.......... 1-262673

Signed and Sealed this

Fifteenth Day of June, 1993

Attest:

MICHAEL K. KIRK

Attesting Officer

Acting Commissioner of Patents and Trademarks